US012603266B2

(12) United States Patent (10) Patent No.: US 12,603,266 B2
Read et al. (45) Date of Patent: Apr. 14, 2026

(54) DEVICE AND METHOD FOR HIGH POWER-DENSITY THERMIONIC ENERGY CONVERSION

(71) Applicant: Space Charge, LLC, Aspen, CO (US)

(72) Inventors: John B. Read, San Diego, CA (US); Daniel C. Sweeney, San Diego, CA (US)

(73) Assignee: Space Charge, LLC, Aspen, CO (US)

( * ) Notice: Subject to any disclaimer, the term of this patent is extended or adjusted under 35 U.S.C. 154(b) by 833 days.

(21) Appl. No.: 17/839,211

(22) Filed: Jun. 13, 2022

(65) Prior Publication Data

US 2023/0088541 A1 Mar. 23, 2023

Related U.S. Application Data

(63) Continuation-in-part of application No. 17/073,918, filed on Oct. 19, 2020, now Pat. No. 11,769,653, which is a continuation of application No. 16/510,611, filed on Jul. 12, 2019, now Pat. No. 10,840,072, which is a continuation of application No. 16/219,515, filed on Dec. 13, 2018, now Pat. No. 10,388,496.

(60) Provisional application No. 63/257,052, filed on Oct. 18, 2021, provisional application No. 63/210,012, (Continued)

(51) Int. Cl.
*H03K 3/08* (2006.01)
*H01J 45/00* (2006.01)
*H03K 3/78* (2006.01)

(52) U.S. Cl.
CPC ................ *H01J 45/00* (2013.01); *H03K 3/08* (2013.01); *H03K 3/78* (2013.01)

(58) Field of Classification Search
CPC .............. H01J 45/00; H03K 3/08; H03K 3/78
See application file for complete search history.

(56) References Cited

U.S. PATENT DOCUMENTS

| | | | |
|---|---|---|---|
| 3,265,910 A | 8/1966 | Thomas | |
| 3,328,611 A | 6/1967 | Davis | |
| 3,460,524 A | 8/1969 | Lazaridis | |
| | | (Continued) | |

FOREIGN PATENT DOCUMENTS

| | | |
|---|---|---|
| CN | 105288675 | 2/2016 |
| FR | 2971552 | 8/2012 |
| | (Continued) | |

OTHER PUBLICATIONS

International Search Report and Written Opinion for PCT/US2018/065494 mailed on Mar. 15, 2019, 10 pages.
(Continued)

*Primary Examiner* — Mark R Gaworecki
(74) *Attorney, Agent, or Firm* — Kilpatrick Townsend & Stockton LLP

(57) ABSTRACT

Thermionic generators are described herein that include a variety of features that allow the devices to efficiently and effectively convert large amounts of thermal energy directly to electrical energy, such as in the form of currents and/or voltages. For example, the thermionic generators can be used to generate an electron beam from a thermionic emission device, and focus or shape the electron beam in such a way that allows the energy of electrons in the electron beam to be captured and converted to electrical energy.

20 Claims, 6 Drawing Sheets

Related U.S. Application Data filed on Jun. 12, 2021, provisional application No. 62/598,582, filed on Dec. 14, 2017.

(56) References Cited

U.S. PATENT DOCUMENTS

| | | | |
|---|---|---|---|
| 3,519,854 | A | 7/1970 | Davis |
| 3,702,408 | A | 11/1972 | Longsderff et al. |
| 4,303,845 | A | 12/1981 | Davis |
| 4,323,808 | A | 4/1982 | Davis |
| 5,459,367 | A | 10/1995 | Davis |
| 5,780,954 | A | 7/1998 | Davis |
| 5,810,980 | A | 9/1998 | Edelson |
| 5,942,834 | A | 8/1999 | Davis |
| 5,981,071 | A | 11/1999 | Cox |
| 5,994,638 | A | 11/1999 | Edelson |
| 6,064,137 | A | 5/2000 | Cox |
| 6,103,298 | A | 8/2000 | Edelson et al. |
| 6,211,465 | B1 | 4/2001 | Streit |
| 6,229,083 | B1 | 5/2001 | Edelson |
| 6,495,843 | B1 | 12/2002 | Tavkelidze |
| 6,762,543 | B1 | 7/2004 | Kang et al. |
| 7,996,807 | B2 | 8/2011 | Grise et al. |
| 8,853,531 | B2 | 10/2014 | Schwede et al. |
| 9,865,789 | B2 | 1/2018 | Geballe et al. |
| 10,109,384 | B2 | 10/2018 | Weber |
| 10,388,496 | B2 | 8/2019 | Sweeney et al. |
| 10,658,144 | B2 | 5/2020 | Clark et al. |
| 10,840,072 | B2 | 11/2020 | Sweeney et al. |
| 11,473,569 | B2 | 10/2022 | Allen et al. |
| 2004/0189141 | A1 * | 9/2004 | Tavkhelidze ............ H01J 45/00 310/306 |
| 2005/0016575 | A1 | 1/2005 | Kumar et al. |
| 2005/0275330 | A1 | 12/2005 | Sung |
| 2012/0227925 | A1 | 9/2012 | Sweeney |
| 2013/0229133 | A1 | 9/2013 | Cheatham, III et al. |
| 2015/0098259 | A1 | 4/2015 | Michael et al. |
| 2016/0042907 | A1 | 2/2016 | Sullivan et al. |
| 2017/0323692 | A1 | 11/2017 | Hubler et al. |

FOREIGN PATENT DOCUMENTS

| | | | |
|---|---|---|---|
| GB | 741058 | 11/1955 | |
| WO | 99/10974 A1 | 3/1999 | |
| WO | 2004077881 | 9/2004 | |
| WO | WO-2005052983 A1 * | 6/2005 | ............. H01J 45/00 |
| WO | WO-2008118234 A2 * | 10/2008 | ............. H10F 10/00 |
| WO | WO-2013173922 A1 * | 11/2013 | ............. H01J 45/00 |
| WO | WO-2017115265 A1 * | 7/2017 | ........... H01J 29/485 |
| WO | 2019118746 A1 | 7/2019 | |

OTHER PUBLICATIONS

International Preliminary Report on Patentability for PCT/US2018/065494 mailed on Jun. 25, 2020, 8 pages.

Rand et al., "C12A7 Electride Hollow Cathode", Conference Paper for the JANNAF Space Subcommittee Meeting, Available online at: https://apps.dtic.mil/dtic/tr/fulltext/u2/a595443.pdf, Apr. 29-May 3, 2013, 8 pages.

Sherehiy Andriy et al: "Thermionic emission properties and the work function determination of arrays of conical carbon nanotubes", Diamond and Related Materials, vol. 34, Apr. 1, 2013, pp. 1-8, XP055826349, NL ISSN: 0925-9635, DOI: 10.1016/j.diamond.2013.01.007 *abstract*.

Supplementary European Search Report for EP 18888422 dated Jul. 21, 2021, 13 pages.

* cited by examiner

200

250

245

300

370

360

301

400

461    462    463    464

401

V₁    V₂    V₃    465    V₄

470

DEVICE AND METHOD FOR HIGH POWER-DENSITY THERMIONIC ENERGY CONVERSION

CROSS REFERENCE TO RELATED APPLICATIONS

This application claims the benefit of and priority to U.S. Provisional Application No. 63/210,012, filed on Jun. 12, 2021, and U.S. Provisional Application No. 63/257,052, filed on Oct. 18, 2021. This application is also a continuation-in-part of U.S. application Ser. No. 17/073,918, filed on Oct. 19, 2020, which is a continuation of U.S. application Ser. No. 16/510,611, now U.S. Pat. No. 10,840,072, filed on Jul. 12, 2019, which is a continuation of U.S. application Ser. No. 16/219,515, now U.S. Pat. No. 10,388,496, filed on Dec. 13, 2018, which claims the benefit of and priority to U.S. Provisional Application No. 62/598,582, filed on Dec. 14, 2017. All the foregoing applications are hereby incorporated by reference their entireties.

FIELD

This invention is in the field of thermal to electrical energy conversion devices. This invention relates generally to a thermionic energy conversion device with a structure and components to achieve high power-density conversion.

Described herein are thermionic energy convertors (TEC), also referred to as thermionic generators or thermionic wave generators (TWG), such as in the form of vacuum electronics, with various systems and subsystems occupying a single, chambered tube, formed with advanced vacuum electronics fabrication techniques to withstand high temperature. The vacuum electronics may also be accompanied by various support circuitry, which may optionally comprise solid state components, and such support circuitry may be optionally populated outside the vacuum region.

Inclusion of an inductive pickup integrated with a collector, a high efficiency resonant power supply, meta-surfaces for passive thermal management, and servo systems for error correction ensure a convertor providing high power density, high efficiency, and high-quality output.

Context

Thermionic generation exploits the Edison effect to convert thermal energy input directly into electrical output. Low conversion efficiency imposed by electrostatic space charge, materials work functions, and fabrication techniques limited earlier attempts to low power output per unit of mass, rendering it uncompetitive as a mode of high-power density electrical generation.

Additional to the above limitations, earlier attempts had several significant limitations, which included the dynamic models used for design. More explicitly, the dynamic design models emphasized thermodynamics of mass and kinetic energy, rather than the primary dynamic of charge and electromagnetic force.

Other liabilities include large dissipative heat and electrical losses. Primarily these include dissipative heat losses through the envelope of the device, and significant electrical losses within the power supply. Also, low work function— no more than 2.6 eV for the emitter, and preferably 1 eV or lower for the collector—facilitates elevated emission levels at temperatures≤1,000° C., and provides for the establishment of a high output voltage to achieve moderate to high power outputs per unit of mass. Previously, the combination of a) ultra-low work function materials, b) thermal durability, and c) current capabilities of 10 amperes and above, was not present in any known substance.

Previous optimization attempts and design variants have typically operated at low voltages and amperages in an effort to mitigate space charge accumulation in the vicinity of the cathode emitter, which chokes off further emissions. In prior implementations, all electron emissions may not be completely absorbed, such as due to back reflections or generation of secondary electrons. To mitigate this, designers historically lessened charge density by maintaining low electrical polarization across the drift space, resulting in lower electron emissions with predictable consequences relating to lower power output.

Experimenters have also sought to control space charge by other means. One approach introduces a low-pressure ionizing fill gas such as Cs to neutralize negative polarization of the space charge to some extent. Another approach reduces the span of the vacuum gap to one micron or less, an expanse that does not permit the accumulation of a dense space charge. Yet another approach uses a so-called deflector grid.

The first approach limits the ultimate efficiency of the generator; the second leaves it vulnerable to short circuits via emitter thermal expansion. The third approach may have no apparent downsides, but does not, by itself, represent the means of achieving a practical thermionic convertor.

Several thermionic conversion proponents have advocated the use of electron guns to shape the space charge into a beam that an electrostatic or inductive pickup can intercept. While this represents a path with considerable promise, in order for it to yield satisfactory results, the electron gun requires a highly efficient power supply, not previously available to researchers attempting to use beam forming systems within the thermionic generator.

Photon-enabled or photon-assisted thermionic convertors produce hybrid systems, which combine vacuum photo cells with purely thermionic convertors. The photo cells in such hybrids initiate the electron emission process, while the thermionic component adds impetus to it.

Technical literature on the subject indicates likelihood of better than 50% conversion efficiency.

Much current focus in thermionic research investigates novel electrode materials of superior performance, the utilization of accelerator grids to disperse the space charge, and the use of micro-fabrication techniques to construct the generators. This design combination has led to improvements with respect to the predictive models, but has not resulted in systems with performance sufficient to challenge incumbent generator technologies.

SUMMARY

The design features in this description address prior deficiencies using various design features. Application of these design features results in a thermally agnostic, efficient and powerful electrical convertor. That application provides bases for rugged, zero-emissions, distributed electrical generation, at capital investment costs in small fractions of competing generation facilities that tap heat sources. Feedback loops applied in some configurations are useful for improving performance. In some cases, however, they may not address all of the deficiencies in the prior art without additional features.

Techniques described herein combine frequency conditioning with respect to radiant inputs (not to alternating current outputs) via advanced surface engineering. An electron gun further conditions and improves coherency of an electron wave prior to a control grid (or anode gun) in order to improve precision energy focusing. A multifunctional inductive pickup may integrate structurally within the central chamber containing the emitter and the collector, or outside the central chamber as a winding. This provides band-gap architecture that reflect high energy frequencies, more easily fabricated geometric channeling structures, and significantly reduces costs. This pickup-collector element, whether architecturally inside the central chamber, or as a winding outside the central chamber, provides, as well, for tight control of physical gaps that would otherwise expand and potentially short due to thermal expansion during operation. In the case where the inductive pickup sits inside the central chamber, integration of the collector with the emitter also occurs by means of pillars that hold the control grid portion of the electron gun in place and mitigate against short circuits due to thermal expansion.

In an aspect, provided herein are thermionic generators. An example thermionic generator of this aspect comprises an evacuated envelope providing a vacuum drift space; an absorbing element for capturing radiant energy; an emitter coupled to the absorbing element for generating emitted electrons using energy from the absorbing element, the emitter arranged to direct the emitted electrons through the vacuum drift space; an electron shaping element arranged to focus the emitted electrons into an electron beam in the vacuum drift space; an anode element positioned to electromagnetically interact with the electron beam in the vacuum drift space; a transducer arranged to extract energy from the electron beam; and a collector arranged to receive the electron beam. Optionally, the electron beam is a non-dissipative electron beam. Optionally, the non-dissipative electron beam is one or more of an accelerating electron beam, a self-healing electron beam, a non-dispersive electron beam, an auto-focusing electron beam, and/or a non-diffractive electron beam.

Any suitable evacuated envelope or evacuated envelope configuration can be used with the thermionic generators described herein. In some examples, the evacuated envelope comprises a non-conducting container enclosing at least the emitter, the electron shaping element, and the collector. In some examples, the evacuated envelope includes one or more electrical feedthroughs to provide electrical communication outside the evacuated envelope to one or more of the emitter, the electron shaping element, or the collector. In some examples, the evacuated envelope further encloses one or more of the absorbing element, the anode element, or the transducer. In some examples, the evacuated envelope includes one or more electrical feedthroughs to provide electrical communication outside the evacuated envelope to one or more of the absorbing element, the anode element, or the transducer. Optionally, the evacuated envelope comprises a dielectric, glass, a polymer, or a ceramic.

Various absorbing elements or absorbing element configurations can be used with the thermionic generators described herein. In some examples, the absorbing element comprises a plasmonic resonator element or plasmonic absorber for capturing radiant energy. In some examples, the absorbing element comprises a plurality of plasmonic resonator elements or plasmonic absorbers each tuned to capture radiant energy of different wavelengths. In some examples, a plasmonic resonator element or plasmonic absorber exhibits a radiant thermal energy capture coefficient higher than a black body radiant thermal energy capture coefficient.

Various emitters or emitter configurations can be used with the thermionic generators described herein. In some examples, the emitter generates emitted electrons using the radiant energy captured by the absorbing element. In some examples, the emitter receives thermal energy from the absorbing element and generates thermally emitted electrons. In some examples, the emitter generates emitted electrons using focused electric fields generated by capture of the radiant energy by the absorbing element. Optionally, the absorbing element and the emitter comprise a same element.

Various electron shaping elements or electron shaping element configurations can be used with the thermionic generators described herein. In some examples, the electron shaping element comprises a Wehnelt cylinder. In some examples, the electron shaping element comprises an axicon electron lens. In some examples, the electron shaping element comprises a Pierce electron gun, a Pierce electron lens, or a component thereof. In some examples, the electron shaping element comprises one or more electrodes arranged about the emitter and having a geometry generating an electric field that constricts a directionality of the emitted electrons and accelerates the emitted electrons to form the electron beam. In some examples, the electron shaping element comprises an inductive element arranged to constrict a directionality of the emitted electrons and accelerate the emitted electrons to form the electron beam. In some examples, the electron shaping element is configured to impart deflections on the emitted electrons to generate the electron beam. In some examples, the electron shaping element is configured to accelerate the electron beam.

Various anode elements or anode element configurations can be used with the thermionic generators described herein. In some examples, the anode element comprises an electron lens including an aperture through which the electron beam passes. In some examples, the anode element is configured to modulate a kinetic energy of the electron beam. In some examples, the anode element is configured to adjust a focus of the electron beam. In some examples, the anode element is configured to modulate a frequency associated with the electron beam. In some examples, the anode element comprises a toroidal electrode. In some examples, the anode element comprises a ring electrode. In some examples, the anode element comprises a Pierce electron gun, a Pierce electron lens, or a component thereof. In some examples, a potential of the anode element is modulatable to provide a variable acceleration or variable focusing effect on the electron beam.

Various transducers or transducer configurations can be used with the thermionic generators described herein. In some examples, the transducer is configured to extract kinetic energy from the electron beam by electromagnetic or electrostatic interaction with the electron beam. In some examples, the transducer comprises an inductor arranged to generate an electric current by electromagnetic or electrostatic interaction with the electron beam. In some examples, the transducer comprises a spoof surface plasmon antenna tuned to absorb at microwave frequencies for absorbing energy from the electron beam.

Various collectors or collector configurations can be used with the thermionic generators described herein. In some examples, the collector comprises a negatively charged sequence of a plurality of pierced parabolic electrodes at successively more negative potentials. In some examples, the collector is configured to extract kinetic energy from the electron beam by electrostatic interaction with the electron beam. In some examples, the collector comprises one or more parabolic electrodes. In some examples, the collector comprises a parabolic depressed collector.

Various other components can be used with the thermionic generators described herein. In some examples, a thermionic generator may comprise or further comprise an external circuit coupled to one or more of the transducer or the collector and configured to receive and/or store energy extracted from the electron beam. In some examples, the external circuit is further coupled to a remote load to provide energy extracted from the electron beam. In some examples, the external circuit comprises one or more inductors electromagnetically coupled to the transducer. In some examples, the external circuit comprises one or more electrodes capacitively coupled to the collector. In some examples, the external circuit comprises a rectifier or full bridge rectifier coupled to the transducer for generating a direct current output from energy extracted from the electron beam.

In some examples, a thermionic generator may comprise or further comprise a modulated power supply in communication with the emitter, the collector, the anode element, or other components of the thermionic generator for modulating voltages applied thereto. In some examples, the modulated power supply is configured to apply voltage pulses of various magnitudes and durations to the emitter, the collector, the anode element, or other components of the thermionic generator. In some examples, the modulated power supply is configured to apply a sinusoidal voltage to the anode element to modulate an intensity of the electron beam. In some examples, the modulated power supply comprises a flyback converter and one or more capacitors.

In another aspect, methods are described herein, such as methods for converting thermal energy to electrical energy. An example method of this aspect comprises providing a converter, such as a converter that is or comprises any of the thermionic generators described herein; exposing the absorbing element of the thermionic generators to radiant energy; controlling potentials on one or more of the emitter, the electron shaping element, the anode element, the transducer, and/or the collector of the thermionic generators to create an electron beam and capture energy from the electron beam as an electrical current or voltage. In some examples, controlling the potentials includes modulating a potential applied to the anode element to control an intensity or speed of the electron beam.

Without wishing to be bound by any particular theory, there can be discussion herein of beliefs or understandings of underlying principles relating to the invention. It is recognized that regardless of the ultimate correctness of any mechanistic explanation or hypothesis, an embodiment of the invention can nonetheless be operative and useful.

DETAILED DESCRIPTION

Thermionic generators are described herein that include a variety of features that allow the devices to efficiently and effectively convert large amounts of thermal energy directly to electrical energy, such as in the form of currents and/or voltages, such as by generating an electron beam using a thermionic emission device, focusing and shaping the electron beam in such a way that allows the energy of electrons in the electron beam to be captured and converted to electrical energy.

Various aspects, components, and geometries of the thermionic generators described herein can improve the efficiency as compared to previous thermionic generators. For example, absorbing elements are described that are highly efficient for absorbing radiant energy (e.g., thermal photons) can be used to capture thermal energy and provide this energy to an emitter to generate emitted electrons. Additionally, techniques for controlling and shaping the emitted electrons into a beam are described, which can further allow for capturing energy of the emitted electrons in an extremely efficient manner.

Figure 1A:
FIG. 1A provides an overview of an example thermionic conversion device and FIG. 1B shows emission of electrons and formation of an electron beam.
Figure 1A:
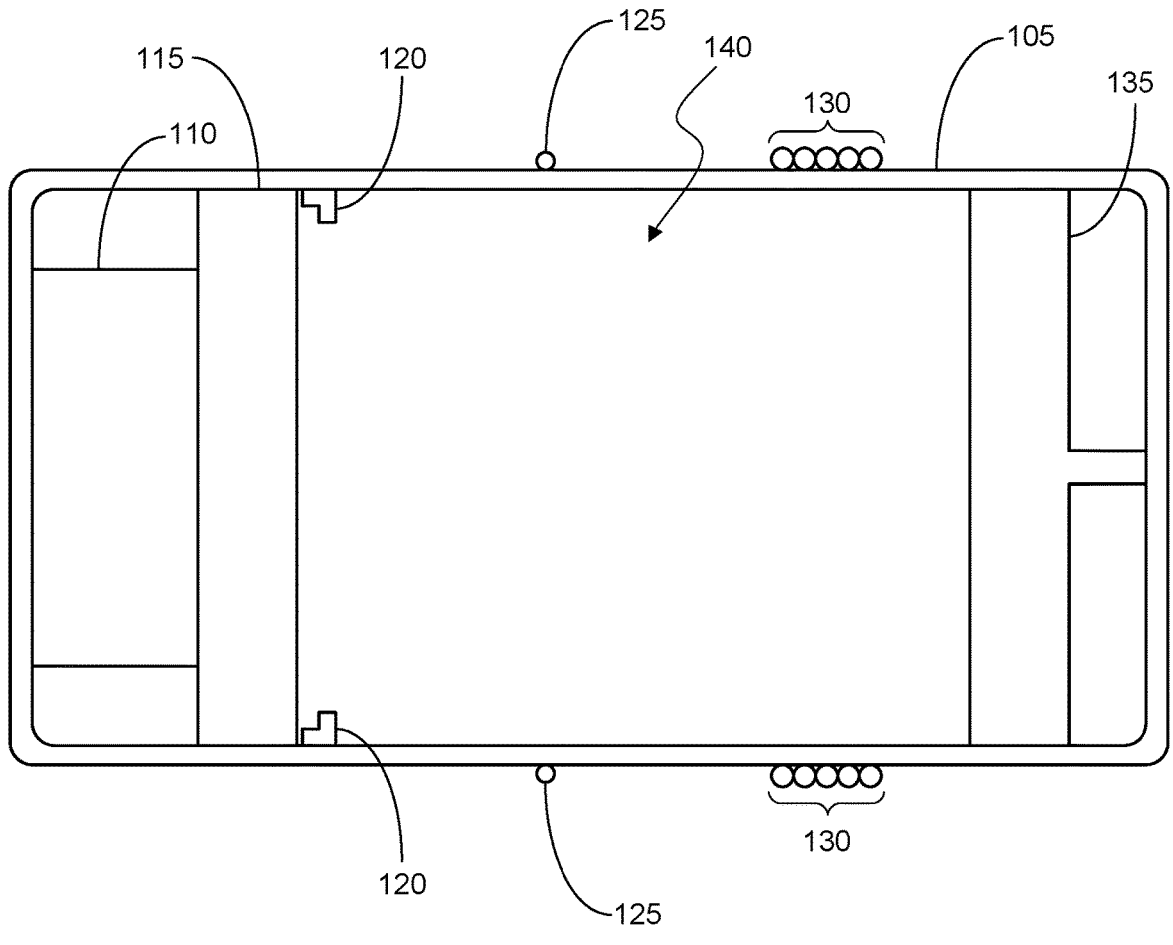

FIG. 1A provides an overview of an example thermionic generator device 100 according to various aspects, implementations, and embodiments. As illustrated, thermionic generator device 100 includes various components, arranged inside or outside of an envelope 105. For example, thermionic generator device 100 includes an absorbing element 110, an emitter 115, an electron shaping element 120, an anode element 125, a transducer 130, and a collector 135. Various other components may be included in thermionic generator device 100, such as described in U.S. Pat. No. 10,388,496, hereby incorporated by reference, but these other components are not depicted in FIG. 1A so as not to obscure certain details. In some examples, one or more of envelope 105, absorbing element 110, emitter 115, electron shaping element 120, anode element 125, transducer 130, and/or collector 135 can have cylindrical symmetry.

Envelope 105 can be evacuated, such as to high vacuum or ultra-high vacuum, for example. In some examples, a pressure within envelope 105 can be less than $10^{-5}$ Torr, such as from $10^{-5}$ Torr to $10^{-12}$ Torr, or lower. Although not shown in FIG. 1A, a getter can be positioned within envelope 105 for removing gas therein. Envelope 105 can comprise any suitable material, such as a dielectric, glass, a polymer, or a ceramic. In some examples, envelope 105 can include various other materials, such as a metal (e.g., stainless steel), at least in part. In some examples, one or more electrical feedthroughs can be included in envelope 105 (not shown in FIG. 1A), such as to provide electrical communication outside envelope 105 to one or more components therein. In some examples, portions of envelope 105 can be at least partially transparent to various wavelengths of electromagnetic radiation, such as infrared or visible wavelengths. In some examples, all or portions of envelope 105 can be thermally conductive, such as to efficiently allow heat energy to pass therethrough, which can be useful, for example, for maintaining a temperature of one or more components therein (e.g., emitter 115).

As illustrated, thermionic generator device 100 includes absorbing element 110, which can comprise any suitable material for absorbing radiant energy from a source (not shown in FIG. 1A). The source of radiant energy can be any suitable source for which conversion of thermal energy to electrical energy is desired. In some examples, the source of radiant energy can be a heat exchanger, such as for recovery of waste heat from any of a variety of sources. In some examples, the radiant energy can be provided by a concentrated solar power system or another system storing energy obtained from a concentrated solar power system.

In some examples, absorbing element 110 may comprise a blackbody type material, such as certain carbonaceous materials (e.g., carbon black, carbon nanotubes, graphite, etc.). Use of such materials can be advantageous for absorbing large amounts of radiant energy (e.g., electromagnetic radiation) over a variety of wavelengths. In some examples, absorbing element 110 can comprise a plasmonic resonator element or plasmonic absorber. Use of plasmonic resonator elements or plasmonic absorbers can be particularly advantageous as these materials can exhibit higher absorption at particular wavelengths than a blackbody material. In some cases, a plasmonic resonator element or plasmonic absorber may exhibit a relatively narrow absorption band, however, so it may be desirable for absorbing element 110 to include a plurality of different plasmonic resonator elements or plasmonic absorbers each tuned to capture radiant energy at different wavelengths to allow for a wide range of absorptions to be achieved.

Absorbing element 110 may be in direct or thermal contact with emitter 115, so as to allow for efficient transfer of thermal energy from absorbing element 110 to emitter 115. In some cases absorbing element 110 and emitter 115 can comprise the same component and/or a unitary structure. Although absorbing element 110 is shown positioned inside envelope 105, some implementations can position absorbing element 110 outside envelope 105, with thermal connections made to emitter 115 through walls of envelope 105 (e.g., via one or more feedthrough components). In some implementations, absorbing element 110 is not used, and thermal energy is directly provided to emitter 115. Emitter 115 can comprise any suitable material for generating thermally emitted electrons, such as a low work function material (e.g., from about 0.25 eV to about 3 eV) like electride materials, as is known in the art. Various surface enhancements on the emitter 115 can be used, such as microtips or emissive coatings, as described in U.S. Pat. No. 10,388,496.

Figure 1B:
Figure 1B:
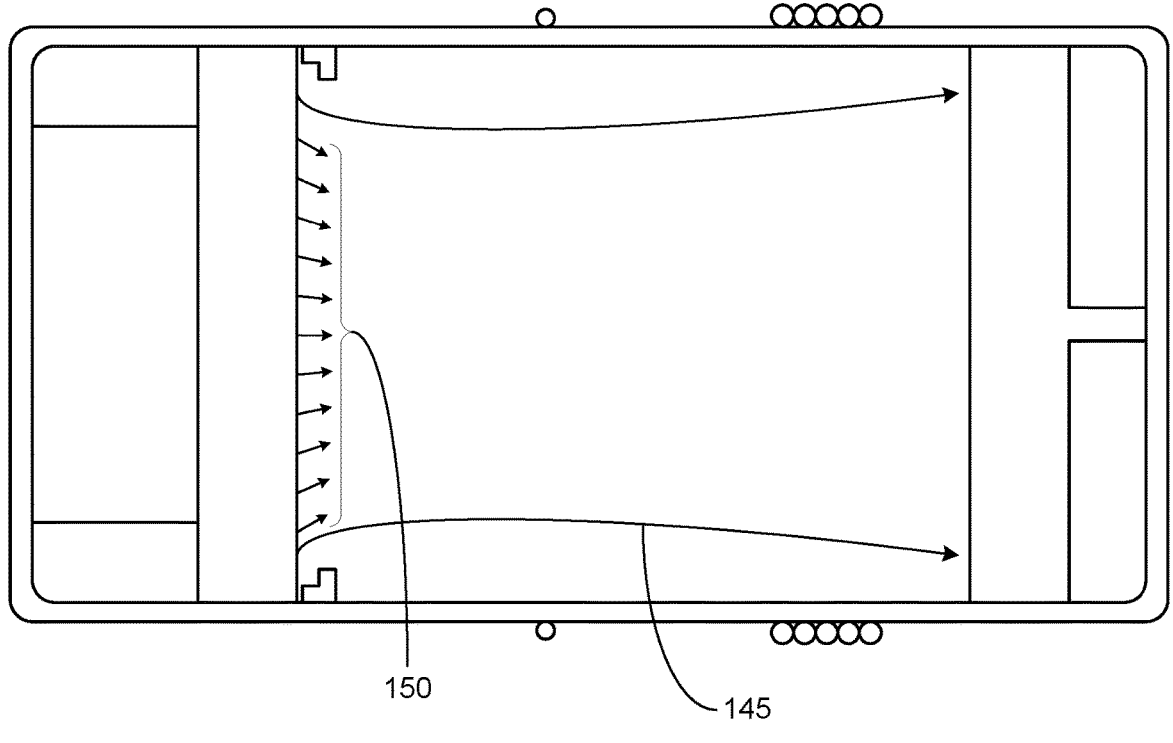

At a suitable temperature, electrons 150 can be emitted from emitter 115 into a drift space 140 within envelope 115. Electron shaping element 120 can be used to direct and focus the emitted electrons 150 suitably within drift space 140 toward collector 135. Electron shaping element 120 can comprise, in some cases, an electron lens or other electrostatic component upon which a voltage may be applied that can serve to focus, direct, and/or accelerate the emitted electrons 150, such as into an electron beam 145 that traverses drift space 140 toward collector 135. Any suitable geometry or configuration of electron shaping element 120 can be used. For example, the geometry of and potential applied to electron shaping element 120 can generate an electric field that constricts a directionality of the emitted electrons 150 and accelerate the emitted electrons 150 to form an electron beam 145. FIG. 1B shows an electron beam 145 formed from emitted electrons 150 in thermionic device 100.

In FIG. 1A, electron shaping element 120 is depicted in the form of a Wehnelt cylinder, which may comprise a hollow cylindrical shape, open ended on the side facing emitter 115, with a recessed shape defining an aperture on the side opposite emitter 115 and facing drift space 140. Other configurations of electron shaping element 120 can be used, such as an axicon type electron lens or other lens configuration. Electron shaping element 120 can comprise any suitable material, such as a metal or other conductive or semiconductive material.

Electron shaping element 120 can operate in conjunction with anode element 125 to focus the emitted electrons 150 from emitter 115 into an electron beam 145 and/or to accelerate the emitted electrons 150. As depicted in FIG. 1A, anode element 125 comprises a ring electrode positioned outside of envelope 105, though some examples position anode element 125 inside of envelope 105. Anode element 125 can serve, in some cases, as an electron gun or a grid electrode. For example, a potential of anode element 125 can be modulated to allow for the emitted electrons 150 to pass therethrough or be restricted, depending on the potential applied to anode element 125. Such a configuration can be useful for modulating the electron beam's intensity to allow for waves of high and low or no intensity to pass towards collector 135. Potentials applied to anode element 125 can be used to control the kinetic energy of the emitted electrons 150, to impart deflections to the emitted electrons 150 to generate the electron beam 145 or to focus/defocus the electron beam 145, to modulate a frequency associated with the electron beam 145, and/or to accelerate the emitted electrons 150 and/or the electron beam 145. Anode element 125 can comprise any suitable material, such as a metal or other conductive or semiconductive material.

Transducer 130 can be a component that can electromagnetically and/or electrostatically interacts with the electron beam 145. As depicted in FIG. 1A, transducer 130 can comprise an inductive element, such as a coil of one or more windings of a wire around envelope 105. Transducer 130 can be arranged so that the electron beam 145 passes through an opening defined by the windings, where the electric current associated with the electron beam 145 can interact with the transducer 130 to generate a decelerating force on the electron beam 145 and an electric current and/or voltage at terminals of the transducer 130. Although transducer 130 is shown in FIG. 1A as positioned outside of envelope 105, some implementations of a thermionic generator device position the transducer inside the envelope. The decelerations on the electron beam 145 can result in kinetic energy of the emitted electrons 150 from emitter 110 being converted to electrical energy within transducer 130. Transducer 130 can comprise any suitable material, such as a metal.

Not all the kinetic energy of the electrons 150 in the electron beam 145 will be converted by transducer 130, and the electrons can be captured at collector 135, which can be configured in a circuit with the emitter 110 so as to provide a return of the captured electrons.

Figure 2A:
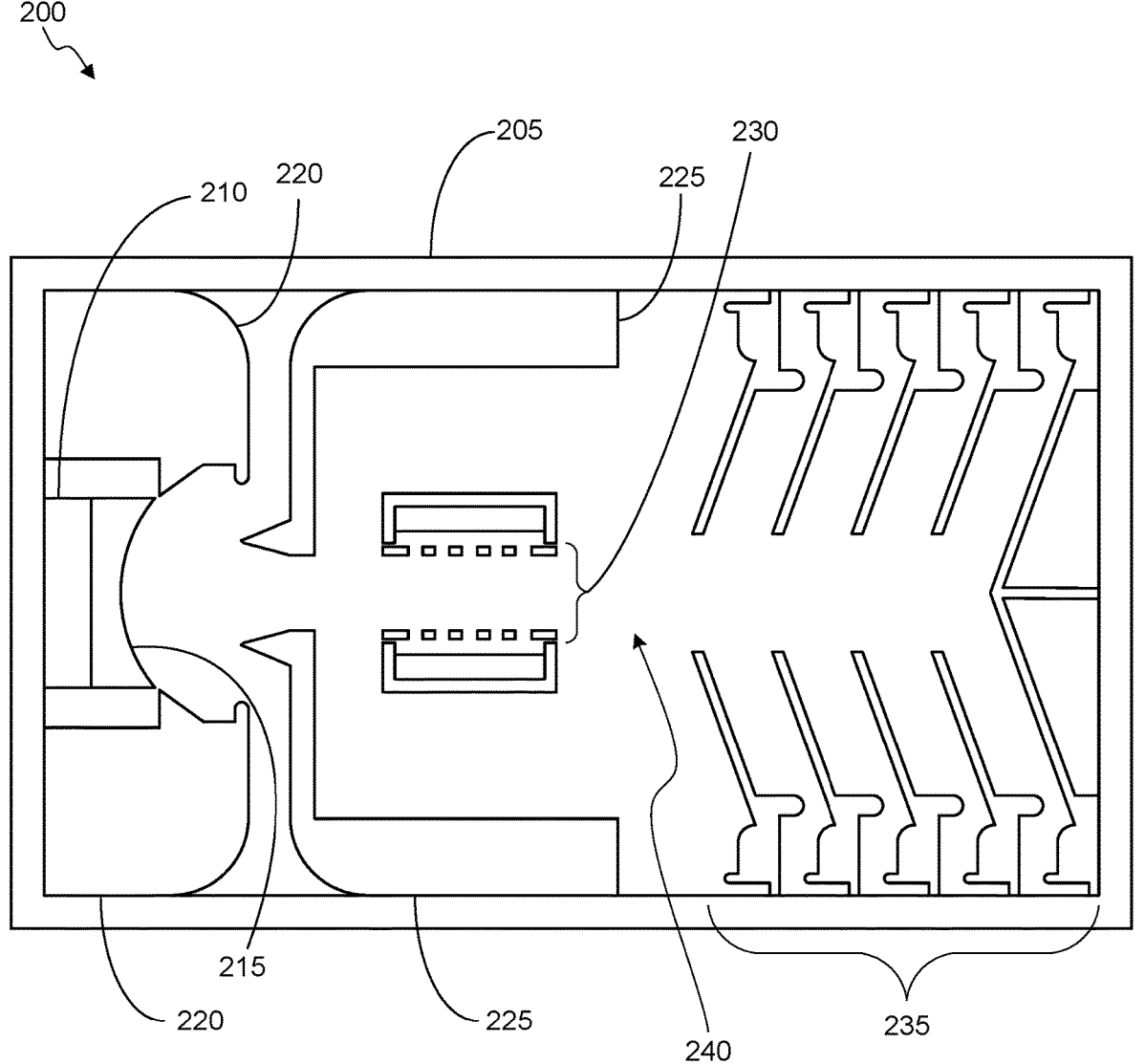
FIG. 2A provides an overview of another example thermionic conversion device and FIG. 2B shows emission of electrons and formation of an electron beam.

Other geometries of an electron shaping element and anode element may be implemented besides a Wehnelt cylinder and a ring electrode depicted in FIG. 1A. For example, as illustrated in FIG. 2A, an electron shaping element and anode element can take the form of or comprise a Pierce gun, with the electron shaping element serving as a focus electrode and the anode element having an aperture therein. Appropriate potentials applied to focus and accelerate the emitted electrons through the aperture in the anode.

In FIG. 2A, example thermionic generator device 200 is shown including an absorbing element 210, an emitter 215, an electron shaping element 220, an anode element 225, a transducer 230, and a collector 235. Various other components may be included in thermionic generator device 200, but these other components are not depicted in FIG. 2A so as not to obscure certain details. In examples, one or more of envelope 205, absorbing element 210, emitter 215, electron shaping element 220, anode element 225, transducer 230, and/or collector 235 can have cylindrical symmetry.

Figure 2B:
Figure 2B:
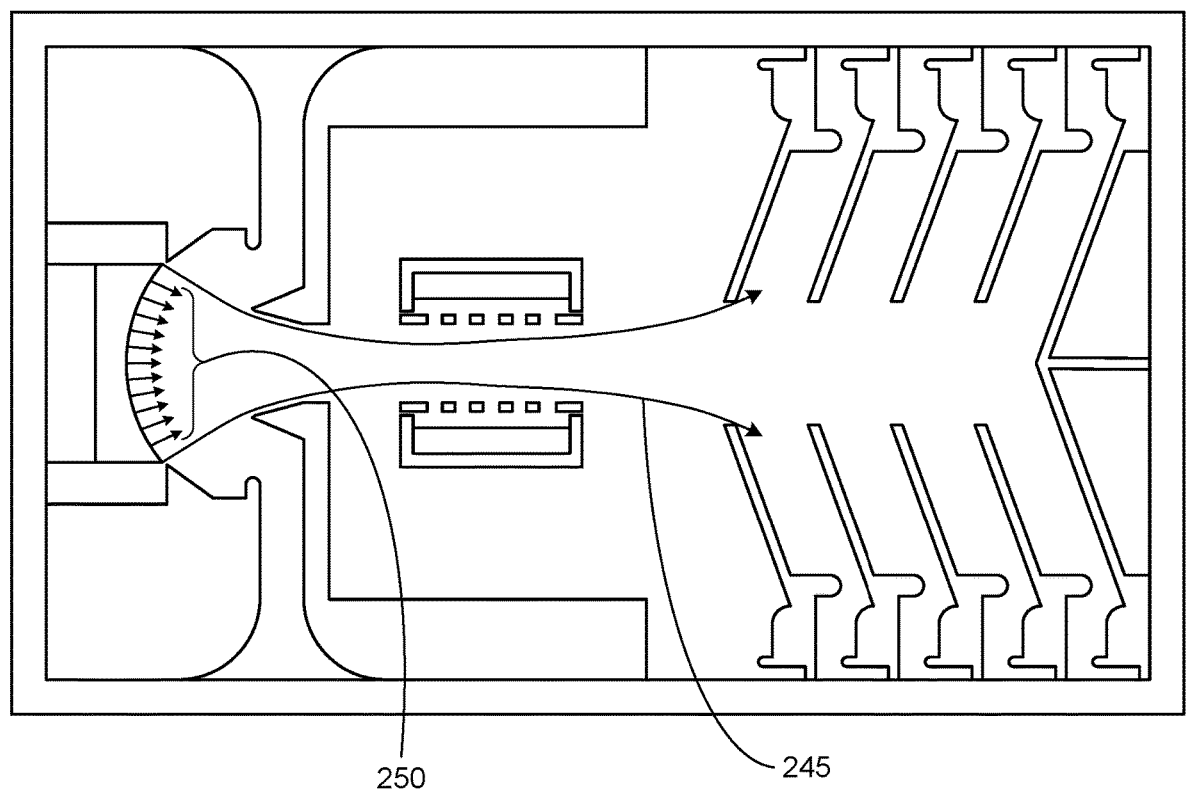

As with FIG. 1A, for thermionic generator device 200, electrons 250 can be emitted from emitter 215 into a drift space 240 within envelope 205. Electron shaping element 220 can be used to direct and focus the emitted electrons 250 suitably within drift space 240 toward collector 235, in concert with anode element 225. FIG. 2B shows electron beam 245 formed from emitted electrons 250 in thermionic generator device 200. Emitter 215, electron shaping element 220 and anode element 225 can together take the form of or comprise a Pierce electron gun. An example configuration for a Pierce gun is provided by Zeng et al., 2013, "Accurate model of electron beam profiles with emittance effects for pierce guns," Physics of Plasmas 23, 093123, DOI: 10.1063/1.4963683, which is hereby incorporated by reference.

In the configuration for thermionic generator device 200 shown in FIG. 2A, transducer 230 comprises a plurality of windings of a conductive material positioned centrally within envelope 205. A supporting structure is shown surrounding transducer 230. This supporting structure is optionally further supported by an interior portion of anode element 225 or another component (e.g., a spacer) within anode element 225. Such an interior portion of anode element 225 or another component is not shown in FIG. 2A so as not to obscure other details. In thermionic generator device 200, collector 235 comprises a plurality of individual collector elements arranged in a configuration to collect electrons from electron beam 245.

Use of an electron shaping element together with an anode element in the thermionic generator device configurations described herein can form an electron beam that exhibits advantageous properties. For example, the electron beam can be a non-dissipative electron beam. Non-dissipative electron beams may have properties allowing the energy of such beams to be efficiently captured by a transducer in a thermionic generator device. For example, the electron beam may be an accelerating electron beam, allowing the kinetic energy of such a beam to be captured and converted to electrical energy. In some examples, the electron beam may be a self-healing electron beam, where the electrons are directed along paths that retain the electrons as part of the beam despite fluctuations that may occur. In some examples, the electron beam may be a non-dispersive electron beam, where the electrons are directed along paths to maintain the electrons as part of the beam despite electrostatic repulsion within the beam. In some examples, the electron beam may take the form of an Airy beam, such as where the electron beam adopts an auto-focusing or non-diffractive configuration.

Figure 3:
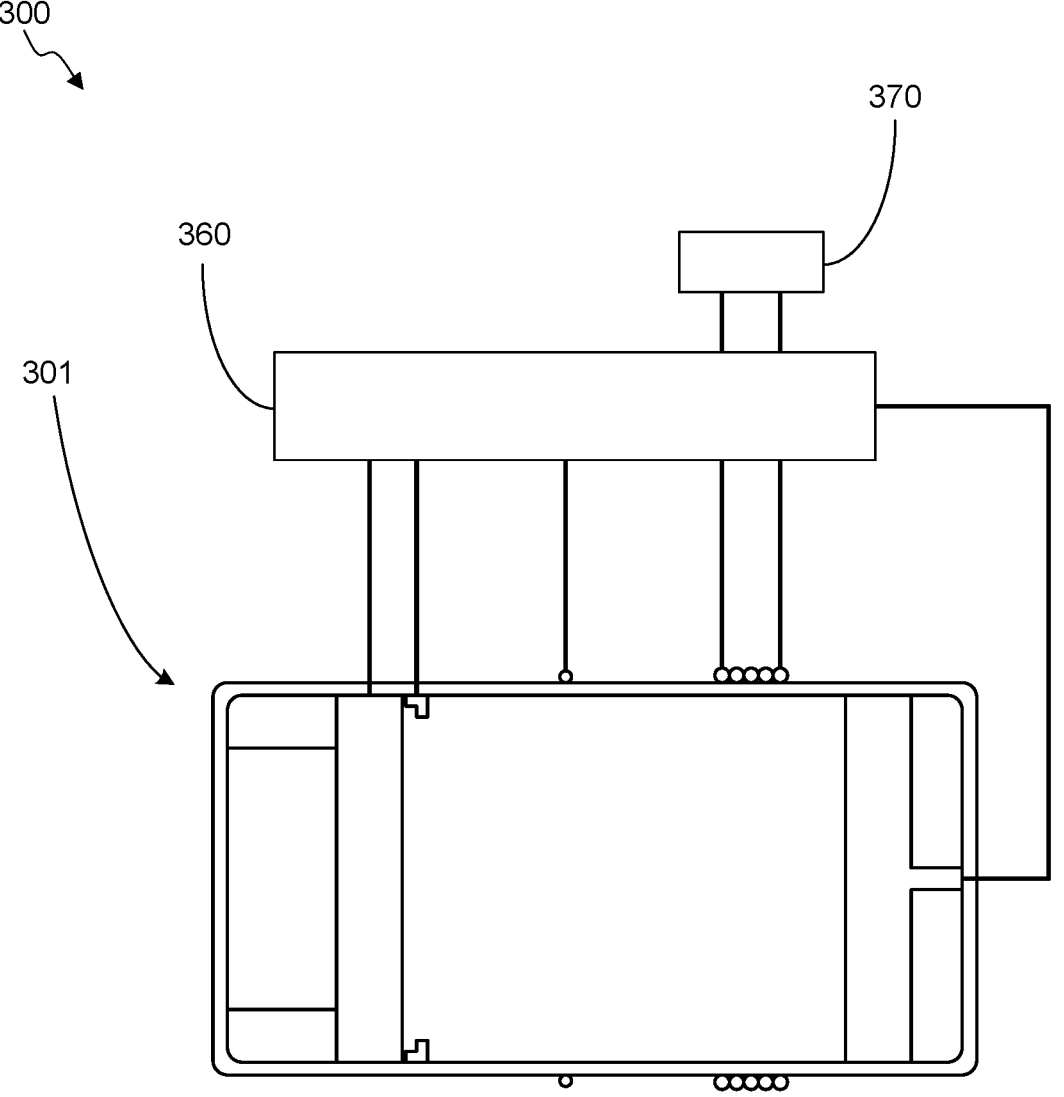
FIG. 3 provides an overview of an example thermionic conversion device and an external circuit in electrical communication for receiving and/or storing energy extracted from an electron beam of the thermionic conversion device.

For operation or to receive or store energy captured from the electron beam, thermionic generator devices may be paired with a circuit including various components. In some examples, the circuit may be referred to as an external circuit, such as when the circuit components are located outside an envelope housing one or more components within an evacuated region. FIG. 3 shows an example thermionic generator system 300, comprising a thermionic generator device 301 and an external circuit 360. External circuit 360 may be electrically coupled to various components of thermionic generator system 300, such as an emitter, an electron shaping element, an anode, a transducer, and or a collector. External circuit 360 may comprise various components, such as one or more electrodes, one or more voltage generators, current generators, or power supplies, one or more current generators, one or more inductors, or the like. In some examples, external circuit may comprise or be electrically coupled to a remote load 370, such as for storing or using energy extracted from the electron beam.

Figure 4:
FIG. 4 provides an overview of an example thermionic conversion device, showing power supplies for applying voltages to different elements of the thermionic conversion device.

FIG. 4 shows another example thermionic generator system 400, comprising a thermionic generator device 401 and various components as part of an external circuit. As illustrated, thermionic generator system 400 includes various power supplies 461, 462, 463, 464, and a remote load 470. Power supplies 461, 462, 463, 464 may comprise any suitable power supplies, such as for providing voltages $V_1$, $V_2$, $V_3$, and $V_4$ to components of thermionic generator device. In some examples, power supplies 461, 462, 463, 464 may comprise modulated power supplies. Optionally, power supplies 461, 462, 463, 464 may be a single power supply or may be independent power supplies. As illustrated, voltages $V_1$, $V_2$, $V_3$, and $V_4$ are shown referenced to a common voltage 465, which may be ground or some other potential. Optionally, one or more of power supplies 461, 462, 463, 464 is or comprises a flyback converter and/or one or more capacitors. Optionally, one or more of power supplies 461, 462, 463, 464 is a switching power supply. In some examples, one or more of power supplies 461, 462, 463, 464 can provide voltages as pulses to the various components. In some examples, one or more of power supplies 461, 462, 463, 464 can provide alternating current (AC) voltages, such as where power supply 463 provides an AC or sinusoidal voltage $V_3$ to the anode, which may have any suitable magnitude and may optionally be biased, such as relative to common voltage 465.

The thermionic generator devices 100, 200, 301 and 401 and systems 300 and 400 may be useful in methods of converting thermal energy to electrical energy. For example, absorbing elements in thermionic generator devices may be exposed to radiant energy, such as to transfer heat energy into the thermionic generator devices, where the heat energy can be used to drive electron emission. Potentials on one or more of an emitter, an electron shaping element, and an anode element can be controlled to create, accelerate, and or shape or focus an electron beam from the emitted electrons. In some examples, energy can be captured from the electron beam at transducers and/or collectors of the thermionic generator devices, such as in the form of a voltage and/or potential captured from the electron beam. Optionally, a potential applied to an anode element can be modulated to control an intensity, kinetic energy or speed, or focus of the electron beam.

The invention may be further understood by the following non-limiting examples.

Example 1

Impact and Fabrication. Indirect thermal to electrical conversion accounts for most of the electricity presently generated by public utilities, making obvious the potential importance of this invention.

Other direct thermal to electrical conversion technologies generally exhibit either poor conversion efficiency (e.g. thermoelectric), unwieldy form factors, or intrinsically high manufacturing and assembly costs (e.g. concentration cells) and excessive complexity.

The techniques described herein represent a thorough reworking of the thermionic generation with respect to all that has gone before. This reworking begins with a more dynamically accurate design model, which can employ feedback for modifying frequency response, reducing certain types of distortion, and changing voltage, current, and output impedance, while yet including lesser thermodynamics of mass and kinetics. Feedback can be used to impose a field assist, to lower the output impedance of the circuit, and to increase gain. Feedback is usually applied to the emitter or the control element. It does not directly affect magnetic fields.

In ancillary circuitry, utilizing servo-control, its form factor represents that of a large-scale system, or network, on a chip. Although recent developers have specified tube form factors; only one has constructed a demonstration entity; that example encompassed only the convertor itself—not any ancillary circuitry.

A network or system-on-a chip provides major architectural and fabrication advantageous resulting from a thoroughly integrated, engineered, monolithic product that eliminates mix and match. It provides highly predictable performance, as well as extreme reliability that distribution grid operators have come to expect. It can achieve a low-cost, turnkey system.

Importantly, fabricators can manufacture a system-on a-chip at a single facility, with a minimum of human interventions. On achieving economies of scale, monolithic form factor drops the price of the complete system substantially lower than a kit of parts system by largely eliminating assembly.

The above form factor allows manufacturers to automate the fabrication process to a large degree, thus reducing costs, reducing unit-to-unit variations, and with that, the reject rate while concurrently achieving the highest tolerances. It likewise significantly reduces the physical weight and scale of the convertor in relationship to the prior art.

The above reworking contrasts, from top to bottom, with a "kit of parts" system in which each part requires separate manufacturing procedures, separate measurement and evaluation, shipping and then storing within a multitude of dedicated spaces. This same kit of parts still requires integration in a final assembly process requiring numerous individual operations and routines.

A tube made of a wide-band gap vacuum electronics material such as silicon carbide, gallium nitride, or various other compositions, provides lower resistive losses than silicon dioxide, as well as greater tolerance of heat.

The techniques described herein detail components of a Thermionic Wave Generator (TWG). In some examples, a TWG can be implemented as a vacuum electronics tube fabricated transducer in the form of an electron tube, which converts conductive or radiant thermal energy directly into electricity, such as by using 5 process-steps, with no moving parts or working fluid. A Thermionic Wave Generator can convert conductive thermal or radiant energy directly into functional electricity in a 5-stage process. Each stage in the process can improve the coherence and direction, while reducing random movement, such that electrons can form a massive directional wave.

In some examples, the 5 stages can include

1) A high-grade heat source that conveys radiant thermal energy to a plasmonic resonator, in which incoming energy of a variety of frequencies converts via geometric shapes of conductive and dielectric materials into a single, semi-coherent, desired frequency for processing by the emitter array. The plasmonic resonator is tuned to absorb a single frequency and is non-responsive to any other frequencies, which will reflect back to the heat source.

2) An emitter or emitter array and electron emission, in which a range of frequencies encounter geometrically-placed elements that produce free electrons via the Edison Effect. For example, plasmonic resonators can convert random phase EMF into a narrow range of frequencies, optionally, functioning as a band pass filter, and excluding out of band radiance.

3) An electron gun or electron shaping element, which electromagnetically further conditions and focuses the free electrons, aiming them at a Control Grid for further processing. A control grid could be part of an electron gun, and often is.

4) A Control Grid, anode gun, or anode element, positively charged, which accelerates the incoming electrons, oscillating between on and off such that the incoming electrons—due to the rapid oscillation—pass through. Or, more specifically, due to the rapid swing from positive to ground potential, or in some cases a negative charge during the second half cycle. The positive charge pulls the electrons through the grid, while the negative charge repels them forcefully as they are leaving the grid. The momentum of the moving electrons that have accelerated toward the control grid keeps them passing through, with the control grid also acting as a lens that aims them at an Inductive Pickup and Collector. In some cases, magnetic deflection grids can be used for steering or constricting an electron beam. The momentum is insufficient without the voltage swing.

5) The Inductive Pickup/Collector, has multiple fundamental functions.

a) The inductive pickup exerts a magnetic braking effect that slows the rapidly moving electrons, feeding some of their energy back to the Control Winding (grid) to increase voltage on the grid, if there is a feedback loop; otherwise the grid draws energy from the power supply. and to maintain desired oscillations of the grid. The breaking effect of induction also mitigates potential bounce-back when the electrons subsequently encounter the collector. The second fundamental function uses the same inductive means to feed an external work circuit.

b) The collector gathers the balance of low energy electrons to feed back to the emitter array for reuse.

In detail in this step-by-step process, some steps contain subcomponents.

5 steps: 1. Tuning Source Energy to Desired Frequencies, in which incoming energy from a variety of frequencies (e.g., from a laser source, multi-wavelength source, or broadband source) converts to a single, semi-coherent, desired frequency for processing by the emitter. An Emitter for electron emission, in which semi-coherent frequencies encounter elements that produce free electrons via the Edison Effect. A plasmonic resonator may also serve to transform ordinary visible light into semi-coherent light.

2. An Electron Gun, which electromagnetically further focuses the free electrons, aiming them at a Control Element for further processing and focusing. The control element could be construed as part of the electron gun. For example, a control element, described below, or accelerator such as grid or anode gun may comprise a subcomponent of the electron gun.

3. A positively charged Control Element accelerates the incoming electrons. Though the control element generally has a positive bias, the voltage may fluctuate as the control signal passes through the accelerator's circuit, and the voltage may swing negative at the bottom of the wave cycle in order to shut off emissions from the momentarily and to repel electrons exiting the grid. The control element may oscillate between on and off such that the incoming electrons due to the oscillation pass through generally without themselves neutralizing against the positive charge of the control grid. Simulations indicate loss of 6% or possibly less Depending on the potential of the control element, the moving electrons that have accelerated toward the control element keeps may passing through, with the control element also acting as a lens that aims them at an Inductive Pickup and Collector, and in the case of the potential of the control element being modulated to a negative potential the electrons may be prevented from passing through.

4. The Inductive Pickup has two fundamental functions: The first fundamental function exerts a magnetic brake on the rapidly moving electrons, removing some of their energy and feeding it back to the Control Grid to increase voltage on the grid, as well as maintaining desired oscillations of the grid. The braking effect of induction also mitigates potential bounce-back when the electrons subsequently encounter the collector. There is one iteration in which the device is driven into self-oscillation. Self-oscillation is more likely to occur in clip and recover circuits where regular cycles of over-shoot and recovery are used to generate and maintain the appropriate frequency. It will be appreciated that self-oscillation is not necessarily present in all iterations.

The second fundamental function uses the same inductive means to extract electrical energy into an external work circuit.

5. Collector. The collector pulls the spent electrons back into the emitter array for reuse via the power supply. In the case in which the inductor resides inside the drift space, it may also serve as an architectural substrate for dielectric pillars that may anchor the control grid in place such that movement during thermal expansion does not cause it to short.

Those 5 steps can further break down into 15 functional subsystems, for example. The integrated, thermionic converter described in this text may comprise the following functional subsystems, in no specific order:

Step 1—Tuning Source Energy to Desired Frequencies. 1. Thermal energy may enters the system via a thermally absorbent surface portion. Alternatively, energy can enter via radiant frequencies that encounter a radiantly absorbent surface. The energy may ultimately be passed to an emitter.

In either case, the energy encounters an array of plasmonic resonators. These resonators comprise an array of inscriptions on the anterior portion of the tube. Plasmonic resonators communicate with the emitter and are directly adjacent to it, but they are separate components, and are made of different materials than those comprising the emitter. This resonator array may comprise micro and nano-scale structures of two and/or three dimensional repetitive geometric forms of conductive materials, the forms themselves embedded in high k dielectric materials.

The above geometry tunes incoming energy—conductive or radiant, to respond to specific frequencies of radiation in the terahertz region. In some cases, it can be considered to be a bandpass filter and it does not change the frequency of the incident radiation. That is, it conditions the incident energy, concentrating and localizing heat, and generating powerful electrical fields. In many examples, plasmonic resonators are normally tuned to a single frequency. In some examples, multiple plasmonic resonators tuned to different frequencies can be used together.

2. Electrons within the conductive structures undergo tuned oscillations and behave collectively in the form of a virtual plasma or plasmon. The deeply subwavelength oscillations vis-à-vis the incident radiation effectively shrinks the waveforms, increasing their intensity per unit of area.

These intensified waveforms result in localized heating, in generation of intense electrical or magnetic fields, and in re-radiation of the incident light in a semi-coherent form; this is true if the plasmonic resonator is provided with a diffraction grid that serves to re-radiate the incident radiation; as indicated the re-radiated emanations are nearly phase coherent. This plasmonic resonator structure favors one type of output.

3. These super-Planckian plasmonic resonators absorb radiance largely in its energetic entirety. Their capacity to transform radiance into fields, as well as palpable heat, means that a thermionic converter with these structures may exhibit an assist—field, or photonic. This assist allows the device to pass higher electrical currents than a pure thermionic generator, and thus achieve higher emissions at less elevated temperatures.

Step 2—an Emitter Array, and Electron Emission. 4. An emitter array (cathode) follows the plasmonic array. The emitter array rests at negative potential, draws energy from the plasmonic structures, and emits electrons as a result. Since electrons emit only from the surface facing a vacuum drift space, only practical structural considerations limit slimness of the surface.

5. The emitter array (in the case of wafer fabrication only) may comprise a number of discrete, low work-function emitters separated from one another by spaces under a millimeter. Work function limits both the operating temperature of the device, and quantity of emitted electrons. Lower work function lowers the threshold temperature for high emissions and increases electron emission. Each mini-emitter functions discreetly. This allows the entire converter to take flat panel form measuring no more than two square centimeters, for example. With several emitters one after the others, the subsequent emitters will be secondary emitters or dynodes.

6. The surface of each mini-emitter employs micro-texturing to produce a multitude of high aspect-ratio ridges or spikes that concentrate electrical charge and result in greater emissions per input of given intensity. The presence of such high aspect-ratio microstructures further lowers the effective work function of the emitter, with all of the same benefits that an intrinsically low work function provides. That is, energetic inputs from plasmonic surfaces to the emitters' micro-textured surfaces further reduce effective work function, device temperature, and increase electron emission.

Step 3—the Electron Gun. 7. A Wehnelt or other focusing cathode comprises the first element in an electron gun. This, minimally, must have one additional element for focusing and accelerating the electrons into an electron wave. Electron charge provides the primary power dynamic. Electron mass provides the connective momentum for movement. A negatively polarized narrow lip around the edge at the end facing into the vacuum gap repels electrons from its surface, causing them to compact into a narrow-focused wave.

8. A magnet assembly provides a second focusing element, and may comprise four bar magnets, two of which have north poles that extend into the gap traversed by the electron beam, and whose south poles face away from the gap. The other two have the opposite orientation. The gun will have as many quadrupole magnet assemblies as it has discrete emitters and their accompanying Wehnelt cathode. Samarium cobalt preferably stands as the magnetic metal of choice, due to its ability to endure high heat without undergoing demagnetization, but that need not be the case in all constructions. For example, in some cases solenoids may be substituted for the magnets. Each of the magnets assumes shape in order to achieve the greatest flux density within the gap, and thus the greatest control over the electron wave. Generally magnetic focusing elements impart a spin to the electrons in the beam, although they may also serve to constrict the beam further.

Step 4—the Control Grid. 9. The next subcomponent one can designate as an anode gun, as an accelerator grid, or as a control grid—referred to as an anode element herein. This has a positive charge, and attracts the increasingly or already coherent electron wave. The electron wave passes through the grid, without impinging on the grid and wastefully losing electrons to the grid circuit. In some implementations, the grid has a lattice structure, with hexagonal ligaments of small dimensions so positioned as to obstruct the electron beam minimally, but primarily to aim and to accelerate the beam. For example, a plate with a large hole in its center.

Because acceleration depends on a varying potential on the grid that rises and falls, the grid requires a relatively high voltage power supply, preferably with a potential between 10 and 100 volts, with an oscillator which causes the grid voltage to vary, supplying the control signal. In vacuum electronics iteration it is a pierced plate, not a lattice.

10. This sub-component enables the control grid to function as stop-band photonic crystal, preventing radiance from crossing the drift space and impinging on the collector. It also reduces dissipative thermal losses.

Step 5a—The Integrated Pickup-Collector, Pickup Description. 11. The unique inductive pickup follows the control grid. In architectural form, and to maintain appropriate gap spacing and to channel electron passage, the pickup integrates with the collector. This pickup comprises conductive traces positioned in configurations where the conductor presents a magnetic metal core for concentrating magnetic flux. The pickup comprises at least two coupled inductors, and serves alternately as a conventional power transformer, and as a flyback; the coupled inductors being the primary and the secondary.

12. The inductive pickup imposes a braking effect on the electron beams, extracts useful energy from it, and alleviates unwanted secondary emission (bounce back) in the following, integrated subcomponent, the collector. This pickup may comprise one or more interleaved coils wound around a magnetic metal armature, which itself can shape as a simple rod, or toroid. Other shapes are possible as well.

13. The techniques described herein may employ a planar inductor, in which a flat spiral or related form substitutes for a coil. This represents a recent development solution to the art. A transformer or flyback requires at least two such spirals, preferably positioned top and bottom on the tube's surface and extending into regions within the chip. Ordinarily an inductive pickup would not be situated within the depths of a microcircuit. A sheath of magnetic metal clasps around the tube. Each electron beam can share a single metal magnetic circuit comprised of core material. The inductor serves multiple purposes that include feedback to the control grid, as well as induced feed to the external work circuit. Induction allows transforming output. Absent a transformer, the voltage would be high and the current low. Similarity in general form to other vacuum electronic devices makes it relatively straightforward to pulse the electron emission to couple with an EM inductor. Although planar inductors are described, in some examples three dimensional inductors may be used in place of planar inductors.

Step 5b—The Integrated Pickup-Collector—Collector Description and Cascade. 14. The next subcomponent in the thermionic generator proper is the flat plate collector, structurally integrated into the inductive pickup. The collector has a low positive potential to pull the spent electrons into the ground return circuit, and from there to the power supply before re-circulating through the electrode circuits. The structural substrate of the integrated pickup and collector also serves as an architectural base for pillars that extend to anchor the control grid thus greatly reducing the likelihood of shorting as the device heats and thermal expansion affects all parts.

15. In a cascaded embodiment, the collector performs an additional duty by serving as the emitter for a subsequent cascaded generator, all in the same monolithic vacuum electronics device. This second stage collector-emitter will follow the same subcomponents present in the 1st stage thermionic generator, but the cascaded 2nd stage will draw heat from the collector of the first stage, which otherwise rests at an elevated temperature requiring either a heat sink or more active thermal management where convective cooling is present.

Forming an Electron Beam. Concepts useful in a thermionic generator include the formation, focusing and acceleration of an internal electron beam that passes through the vacuum drift space. Nevertheless, few researchers in the field of thermionic emission have sought to endow their devices with any means of engendering or conditioning such an electron beam. In most cases involving the prior art, a beam was not present at any time in which the device was in operation, but rather a diffuse electron gas or cloud known as a space charge, lacking any considerable concentration of force.

Focused electron beams characterize cavity resonator types of electron tubes used in various high-power applications, though not in thermionic generation. The usual means of forming such beams are electron lenses, also known as electron guns. These are assemblages of inductors and/or electrodes communicating with high voltage power supplies. By virtue of the electric or magnetic fields they project, they exert motive forces upon the electrons comprising the beam, allowing the space charge to be compressed or constricted into a narrow, concentrated beam, which will forcefully convey energy to a transducer.

Focused and intense electron beams are capable of interacting with either or both inductive or electrostatic pickups, either or both of which exert a braking effect on the beam, and extract most of its energy in the process. Absent a focused and energetic electron beam, such pickups are not effective. And, in as much as the pickup plays a role in the generator attaining high conversion efficiency and large power outputs, useful employment involves utilizing the beam to its best advantage via an electromagnetic pickup.

Design and configuration of the focusing and acceleration apparatus are useful for achieving a working, high-efficiency thermionic generator. Achieving effective control over the beam can be challenging because electrons tend to repel one another, and thus compromise the focus. With compromised focus, stray electrons will then strike positively charged accelerator components and undergo absorption. Such absorbed electrons generate electrical currents and consequent electrical losses.

Designs that condition the beam so that no electrons manifest transverse velocities, because these give rise to multitudes of the aforementioned interceptions by a positively charged acceleration electrode, can be advantageous. A high degree of uniformity with respect to the speed of propagation among the body of emitted electrons is also desirable because it can simplify the design of the pickup or pickups.

Such uniformity is typically not present in the immediate vicinity of the emitter, which may emit electrons at various velocities and with various directionalities; moreover, the beam is apt to be unstable as it propagates, making it prone to dispersion and defocusing.

In example thermionic wave generators, two methods for remediating these deficiencies can be used. The first is an accelerating electron beam. The second is the inclusion of an electron lens, also known as an electron gun. Additional means can also be used.

Non-dissipative, accelerating Electron Beams. The first form of remediation can, for example, create a non-dissipative, self-accelerating beam.

This remedy may be achieved in the conformation and behaviors of the electron beam itself, which, when correctly shaped and conditioned, exhibits a constant profile and amplitude, is non-dispersive, non-diffractive, self-healing, auto-focusing, and accelerates as it propagates. It has not been previously utilized in a thermionic generator. It offers distinct advantages.

The above properties can be associated with a family of electron beams characterized by various electrical filter functions and geometries. Such beams are often assigned such properties through the agency of phase mask, through which the beam passes initially, and emerges transformed.

A beam with such behaviors coheres throughout its journey through the drift space, and it allows the designer to dispense with a customary electron gun as well as a number of other subcomponents. A pickup may be useful, as well as some passive front-end circuitry or optical components located just beyond the emitter. Such elements can be utilized to create the beam and provide unique behaviors. Otherwise, the electron tube operates similarly to a diode.

This sort of electrical generator may advantageously involve no interception by accelerator electrodes, and such electrodes are not required. A pickup remains present; given the reduction in internal circuit elements, the power supply may be significantly simplified as well.

Accelerating beams generally are understood to be generated using electromagnetic radiance, but this can also be achieved using electron beams.

The first such accelerating optical beam to be identified was the Airy beam, named after the English astronomer George Airy, and first generated experimentally in 2007, although it was predicted earlier. Other types followed, including Bessel beams and various non-paraxial beams.

Such beams often, but not always, describe curved trajectories, but the curvature tends to be very slight at the dimensions in question. While some such beams undergo gyrations and display vorticity, most are fairly linear. In some cases, their use in some thermionic generators may be exclusive of use of inductive pickups comprising coils whose bobbins are parallel to the path of the beam. The beam could, however, be permitted to pass through a spoof plasmon antenna tuned to the appropriate microwave frequency which would tend to extract all of the energy from the beam, thus achieving the very highest conversion efficiency in a thermionic generator.

Electron Guns. A tried and true electron gun, commonly used in inductive output tubes has a concave emitter that is a section of sphere and a focusing apparatus comprising negative electrodes adjacent to the cathode, and an anode gun comprising a plate with an aperture for the passage of the electron beam and which modulates the beam with a control signal. This is followed by a narrow passageway serving as a drift space, which may not be considered a part of the electron gun proper in all examples. The type known as Pierce guns maintain optimal control over the beam properties and geometry, and occasion the lowest electrical losses of any subspecies of electron gun.

Parabolic Depressed Collectors. Another advantageous configuration includes use of a parabolic depressed collector comprising minimally of two stages and two negatively charged plates with apertures to admit the spent electron beam, said collector serving to extract what residual energy remains in it via electrostatic braking. Such depressed collectors are described in microwave transmitter tubes and other industrial cavity resonator tubes, but have not been utilized in thermionic generators, although use of electrostatic braking has been achieved through the use of a single stage, negatively charged collector of more rudimentary design and construction.

Plasmonic Microwave Antenna. Another technique for achieving high conversion efficiency includes substitution of the aforementioned spoof plasmonic microwave antenna for a coil inductor. Although some cavity resonator tubes operate at microwave or millimeter wave frequencies with antennas affixed to the output of such tubes, such an antenna has yet to be employed as an energy transfer device for a thermionic generator. Spoof plasmonic microwave antennas hold a number of advantages over more conventional designs including absence of side or back lobes in a focused transmission radio beam, complete absorption of incident electromagnetic radiation, and the ability to manipulate voltage levels within the hard-wired output circuitry. Examples of thermionic generators described herein can include such a spoof plasmonic microwave antenna.

Example Implementations

Example Implementation 1 is a thermionic generator comprising one or more of:

a. an evacuated envelope providing a vacuum drift space that serves as a channel for the propagation of a focused electron beam that effectuates the energy conversion by transferring electrical energy to an external wired circuit, and also provides for the containment of the radiance present within the envelope, thus minimizing dissipative losses.

b. a plasmonic resonator providing for the complete absorption of a highly energetic optical input such that the efficacy of the radiant thermal capture exceeds the black body limit, said plasmonic resonator also imposing a reduction in the wavelength of the captured radiance though not its frequency, and such wavelength reductions resulting in the incident radiance becoming highly concentrated and forceful, and facilitating localized heating that will support an elevated thermal gradient in the interest of high efficiency as well as the projection of intense electrical fields that will facilitate the process of thermionic generation and augment the amperage of the electrical currents emanating from the emitter, c. an apparatus comprising a holographic diffractive grating for the purpose of imposing strategic deflections upon the electrons emerging from the surface of the emitter, this resulting in the creation of what is known as a non-dissipative, accelerating electron beam whose acceleration is accomplished by means of stored energy within the beam itself and not by electrodes lying in the path of the beam, and said beam being further characterized by an absence of dispersion or diffraction as it makes its way across the drift space, and by self-healing properties that tend to preserve the beam's conformation, as well as auto focusing characteristics that render the beam particularly energetic as it engages the pickup transducer, d. alternatively, an electron gun comprising electrodes and/or inductive elements for the purpose of constricting and accelerating the electron beam, normalizing the velocity and directionality of the individual electrons comprising the beam, and minimizing what are known as transverse velocities which represent trajectories that are perpendicular to the intended direction of propagation or nearly so.

e. a transducer for extracting energy from the electron beam, and comprising variously of an inductive coil for interaction with a gyrating column of electrons, and exerting a braking effect upon them by means of a back electromotive force, or a negatively charged sequence of pierced parabolic electrodes resting at successively higher voltage potentials as well as an integrated ground return circuit, and this assemblage also exerting a braking effect although one that is electrostatic rather than electromagnetic in character, or a combination of electromagnetic and electrostatic transducers, and, lastly, a spoof plasmonic antenna tuned to microwave frequencies and capable of absorbing substantially all of the energy conveyed by the electron beam as well as stepping the voltage levels of the resultant current up or down according to the requirements of the circuitry receiving the radio transmission emanating from the spoof plasmonic antenna, such circuitry, in most cases, residing at distances that are near field with respect to the antenna and might not exceed a few millimeters, Example Implementation 2 is the thermionic generator of example implementation 1 where an external circuit is present for the purpose of storing the electrical energy that has been generated, or of conveying it to an electrical load or loads representing one or more electrical or electronic appliances that might perform useful tasks, the external circuit comprising one or more of:

a. a secondary or tertiary winding communicating with the inductive transducer and essentially integrated with that transducer, and coupling strongly with its primary winding, b. or optionally an electrode that capacitively couples with the negatively charged collector plates, and generates alternating current at the same frequency at which the electron beam has been modulated, c. a rectifier bridge for interfacing with the spoof plasmonic microwave antenna and generating a direct current output from the microwave alternating current standing wave present in the antenna, Example Implementation 3 is the thermionic generator of example implementation 1 or 2 wherein a modulated power supply is present to energize the several electrodes comprising one or more of the emitters, collector, and electron gun, and also to power control circuitry such as active voltage regulators and oscillators, a. a high Q resonant flyback circuit for creating saw tooth waves in lieu of a set of switching transistors for generating a high frequency pulse train for input into the primary of the power supply transformer, said flyback being novel and innovative by virtue of the presence of a high current electron tube in place of solid-state switches for the purpose of releasing stored electrical energy in order to maintain the voltage rails at a constant potential, b. alternately a virtual power supply comprising a spoof plasmonic transducer possessing arrays of sub-wavelength resonators providing for varying degrees of wavelength constriction and intensification such that a number of different voltages may be assigned to the panoply of electrodes and/or solenoids, said varied supply rails being conveyed by re-radiated microwave transmissions launched from a number of diffraction gratings associated with the spoof plasmonic antenna.

Illustrative Aspects

As used below, any reference to a series of aspects is to be understood as a reference to each of those examples disjunctively (e.g., "Aspects 1-4" is to be understood as "Aspect 1, 2, 3, or 4").

Aspect 1 is a thermionic generator comprising: an evacuated envelope providing a vacuum drift space; an absorbing element for capturing radiant energy; an emitter coupled to the absorbing element for generating emitted electrons using energy from the absorbing element, the emitter arranged to direct the emitted electrons through the vacuum drift space; an electron shaping element arranged to focus the emitted electrons into an electron beam in the vacuum drift space; an anode element positioned to electromagnetically interact with the electron beam in the vacuum drift space; a transducer arranged to extract energy from the electron beam; and a collector arranged to receive the electron beam.

Aspect 2 is the thermionic generator of aspect 1, wherein the electron beam is a non-dissipative electron beam.

Aspect 3 is the thermionic generator of any of aspects 1-2, wherein the non-dissipative electron beam is an accelerating electron beam, a self-healing electron beam, a non-dispersive electron beam, an auto-focusing electron beam, and/or a non-diffractive electron beam.

Aspect 4 is the thermionic generator of any of aspects 1-3, wherein the evacuated envelope comprises a non-conducting container enclosing at least the emitter, the electron shaping element, and the collector.

Aspect 5 is the thermionic generator of any of aspects 1-4, wherein the evacuated envelope includes one or more electrical feedthroughs to provide electrical communication outside the evacuated envelope to one or more of the emitter, the electron shaping element, or the collector.

Aspect 6 is the thermionic generator of any of aspects 1-5, wherein the evacuated envelope further encloses one or more of the absorbing element, the anode element, or the transducer.

Aspect 7 is the thermionic generator of any of aspects 1-6, wherein the evacuated envelope includes one or more electrical feedthroughs to provide electrical communication outside the evacuated envelope to one or more of the absorbing element, the anode element, or the transducer.

Aspect 8 is the thermionic generator of any of aspects 1-7, wherein the evacuated envelope comprises a dielectric, glass, a polymer, or a ceramic.

Aspect 9 is the thermionic generator of any of aspects 1-8, wherein the absorbing element comprises a plasmonic resonator element or plasmonic absorber for capturing radiant energy.

Aspect 10 is the thermionic generator of any of aspects 1-9, wherein the absorbing element comprises a plurality of plasmonic resonator elements or plasmonic absorbers each tuned to capture radiant energy of different wavelengths.

Aspect 11 is the thermionic generator of any of aspects 1-10, wherein the plasmonic resonator element or plasmonic absorber exhibits a radiant thermal energy capture coefficient higher than a black body radiant thermal energy capture coefficient.

Aspect 12 is the thermionic generator of any of aspects 1-11, wherein the emitter generates emitted electrons using the radiant energy captured by the absorbing element.

Aspect 13 is the thermionic generator of any of aspects 1-12, wherein the emitter receives thermal energy from the absorbing element and generates thermally emitted electrons.

Aspect 14 is the thermionic generator of any of aspects 1-13, wherein the emitter generates emitted electrons using focused electric fields generated by capture of the radiant energy by the absorbing element.

Aspect 15 is the thermionic generator of any of aspects 1-14, wherein the absorbing element and the emitter comprise a same element.

Aspect 16 is the thermionic generator of any of aspects 1-15, wherein the electron shaping element comprises a Wehnelt cylinder.

Aspect 17 is the thermionic generator of any of aspects 1-16, wherein the electron shaping element comprises an axicon electron lens.

Aspect 18 is the thermionic generator of any of aspects 1-17, wherein the electron shaping element comprises one or more electrodes arranged about the emitter and having a geometry generating an electric field that constricts a directionality of the emitted electrons and accelerates the emitted electrons to form the electron beam.

Aspect 19 is the thermionic generator of any of aspects 1-18, wherein the electron shaping element comprises an inductive element arranged to constrict a directionality of the emitted electrons and accelerate the emitted electrons to form the electron beam.

Aspect 20 is the thermionic generator of any of aspects 1-19, wherein the electron shaping element is configured to impart deflections on the emitted electrons to generate the electron beam.

Aspect 21 is the thermionic generator of any of aspects 1-20, wherein the electron shaping element is configured to accelerate the electron beam.

Aspect 22 is the thermionic generator of any of aspects 1-21, wherein the anode element comprises an electron lens including an aperture through which the electron beam passes.

Aspect 23 is the thermionic generator of any of aspects 1-22, wherein the anode element is configured to modulate a kinetic energy of the electron beam.

Aspect 24 is the thermionic generator of any of aspects 1-23, wherein the anode element is configured to adjust a focus of the electron beam.

Aspect 25 is the thermionic generator of any of aspects 1-24, wherein the anode element is configured to modulate a frequency associated with the electron beam.

Aspect 26 is the thermionic generator of any of aspects 1-25, wherein a potential of the anode element is modulatable to provide a variable acceleration or variable focusing effect on the electron beam.

Aspect 27 is the thermionic generator of any of aspects 1-26, wherein the transducer is configured to extract kinetic energy from the electron beam by electromagnetic or electrostatic interaction with the electron beam.

Aspect 28 is the thermionic generator of any of aspects 1-27, wherein the transducer comprises an inductor arranged to generate an electric current by electromagnetic or electrostatic interaction with the electron beam.

Aspect 29 is the thermionic generator of any of aspects 1-28, wherein the transducer comprises a spoof surface plasmon antenna tuned to absorb at microwave frequencies for absorbing energy from the electron beam.

Aspect 30 is the thermionic generator of any of aspects 1-29, wherein the collector comprises a negatively charged sequence of a plurality of pierced parabolic electrodes at successively more negative potentials.

Aspect 31 is the thermionic generator of any of aspects 1-30, wherein the collector is configured to extract kinetic energy from the electron beam by electrostatic interaction with the electron beam.

Aspect 32 is the thermionic generator of any of aspects 1-31, wherein the collector comprises one or more parabolic electrodes.

Aspect 33 is the thermionic generator of any of aspects 1-32, wherein the collector comprises a parabolic depressed collector.

Aspect 34 is the thermionic generator of any of aspects 1-33, further comprising: an external circuit coupled to one or more of the transducer or the collector and configured to receive and/or store energy extracted from the electron beam.

Aspect 35 is the thermionic generator of any of aspects 1-34, wherein the external circuit is further coupled to a remote load to provide energy extracted from the electron beam.

Aspect 36 is the thermionic generator of any of aspects 1-35, wherein the external circuit comprises one or more inductors electromagnetically coupled to the transducer.

Aspect 37 is the thermionic generator of any of aspects 1-36, wherein the external circuit comprises one or more electrodes capacitively coupled to the collector.

Aspect 38 is the thermionic generator of any of aspects 1-37, wherein the external circuit comprises a rectifier or full bridge rectifier coupled to the transducer for generating a direct current output from energy extracted from the electron beam.

Aspect 39 is the thermionic generator of any of aspects 1-38, further comprising: a modulated power supply in communication with the emitter, the collector, the anode element, or other components of the thermionic generator for modulating voltages applied thereto.

Aspect 40 is the thermionic generator of any of aspects 1-39, wherein the modulated power supply is configured to apply voltage pulses of various magnitudes and durations to the emitter, the collector, the anode element, or other components of the thermionic generator.

Aspect 41 is the thermionic generator of any of aspects 1-40, wherein the modulated power supply is configured to apply a sinusoidal voltage to the anode element to modulate an intensity of the electron beam.

Aspect 42 is the thermionic generator of any of aspects 1-41, wherein the modulated power supply comprises a flyback converter and one or more capacitors.

Aspect 43 is a method of converting thermal energy to electrical energy, the method comprising: providing a converter comprising the thermionic generator of any of aspects 1-42; exposing the absorbing element to radiant energy; controlling potentials on one or more of the emitter, the electron shaping element, the anode element, the transducer, and/or the collector to create the electron beam and capture energy from the electron beam as an electrical current or voltage.

Aspect 44 is the method of aspect 43, wherein controlling the potentials includes modulating a potential applied to the anode element to control an intensity or speed of the electron beam.

REFERENCES

Zeng et al., 2013, "Accurate model of electron beam profiles with emittance effects for pierce guns," Physics of Plasmas 23, 093123, DOI: 10.1063/1.4963683

Hou et al., 2020, "Enhanced Broadband Plasmonic Absorbers with Tunable Light Management of Flexible Tapered Metasurface," ACS Appl. Mater. Interfaces 12, 56178-56185, DOI: 10.1021/acsami.0c16189

U.S. Pat. Nos. 3,265,910, 3,328,611, 3,519,854, 3,460,524, 3,702,408, 4,303,845, 4,323,808, 5,459,367, 5,780,954, 5,810,980, 5,942,834, 5,981,071, 5,994,638, 6,103,298, 6,211,465, 6,229,083, 6,495,843, 8,853,531, 9,865,789, 8,853,531, 10,388,496, and 10,658,144.

STATEMENTS REGARDING INCORPORATION
BY REFERENCE AND VARIATIONS

All references throughout this application, for example patent documents, including issued or granted patents or equivalents and patent application publications, and non-patent literature documents or other source material are hereby incorporated by reference herein in their entireties, as though individually incorporated by reference.

All patents and publications mentioned in the specification are indicative of the levels of skill of those skilled in the art to which the invention pertains. References cited herein are incorporated by reference herein in their entirety to indicate the state of the art, in some cases as of their filing date, and it is intended that this information can be employed herein, if needed, to exclude (for example, to disclaim) specific embodiments that are in the prior art.

When a group of substituents is disclosed herein, it is understood that all individual members of those groups and all subgroups and classes that can be formed using the substituents are disclosed separately. When a Markush group or other grouping is used herein, all individual members of the group and all combinations and subcombinations possible of the group are intended to be individually included in the disclosure. As used herein, "and/or" means that one, all, or any combination of items in a list separated by "and/or" are included in the list; for example "1, 2 and/or 3" is equivalent to "1, 2, 3, 1 and 2, 1 and 3, 2 and 3, or 1, 2 and 3".

Every formulation or combination of components described or exemplified can be used to practice the invention, unless otherwise stated. Specific names of materials are intended to be exemplary, as it is known that one of ordinary skill in the art can name the same material differently. It will be appreciated that methods, device elements, starting materials, and synthetic methods other than those specifically exemplified can be employed in the practice of the invention without resort to undue experimentation. All art-known functional equivalents, of any such methods, device elements, starting materials, and synthetic methods are intended to be included in this invention. Whenever a range is given in the specification, for example, a temperature range, a time range, or a composition range, all intermediate ranges and subranges, as well as all individual values included in the ranges given are intended to be included in the disclosure.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. Any recitation herein of the term "comprising", particularly in a description of components of a composition, in a description of a method, or in a description of elements of a device, is understood to encompass those compositions, methods, or devices consisting essentially of and consisting of the recited components or elements, optionally in addition to other components or elements. The invention illustratively described herein suitably may be practiced in the absence of any element, elements, limitation, or limitations which is not specifically disclosed herein.

The terms and expressions which have been employed are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

What is claimed is:

1. A thermionic generator comprising:
    an evacuated envelope providing a vacuum drift space;
    an absorbing element for capturing radiant energy;
    an emitter coupled to the absorbing element for generating emitted electrons using energy from the absorbing element, the emitter arranged to direct the emitted electrons through the vacuum drift space;
    an electron shaping element arranged to focus the emitted electrons into an electron beam in the vacuum drift space;
    an anode element positioned to electromagnetically interact with the electron beam in the vacuum drift space;
    a transducer arranged to extract energy from the electron beam; and
    a collector arranged to receive the electron beam.

2. The thermionic generator of claim 1, wherein the electron beam is a non-dissipative electron beam.

3. The thermionic generator of claim 1, wherein the absorbing element comprises a plasmonic resonator element or plasmonic absorber for capturing radiant energy.

4. The thermionic generator of claim 3, wherein the absorbing element comprises a plurality of plasmonic resonator elements or plasmonic absorbers each tuned to capture radiant energy of different wavelengths.

5. The thermionic generator of claim 3, wherein the plasmonic resonator element or plasmonic absorber exhibits a radiant thermal energy capture coefficient higher than a black body radiant thermal energy capture coefficient.

6. The thermionic generator of claim 1, wherein the emitter generates emitted electrons using the radiant energy captured by the absorbing element, wherein the emitter receives thermal energy from the absorbing element and generates thermally emitted electrons, or wherein the emitter generates emitted electrons using focused electric fields generated by capture of the radiant energy by the absorbing element.

7. The thermionic generator of claim 1, wherein the electron shaping element comprises a Wehnelt cylinder.

8. The thermionic generator of claim 1, wherein the electron shaping element comprises an axicon electron lens.

9. The thermionic generator of claim 1, wherein the electron shaping element comprises one or more electrodes arranged about the emitter and having a geometry generating an electric field that constricts a directionality of the emitted electrons and accelerates the emitted electrons to form the electron beam, wherein the electron shaping element comprises an inductive element arranged to constrict a directionality of the emitted electrons and accelerate the emitted electrons to form the electron beam, or wherein the electron shaping element is configured to impart deflections on the emitted electrons to generate the electron beam.

10. The thermionic generator of claim 1, wherein the anode element comprises an electron lens including an aperture through which the electron beam passes.

11. The thermionic generator of claim 1, wherein a potential of the anode element is modulatable to provide a variable acceleration or variable focusing effect on the electron beam.

12. The thermionic generator of claim 1, wherein the transducer is configured to extract kinetic energy from the electron beam by electromagnetic or electrostatic interaction with the electron beam, wherein the transducer comprises an inductor arranged to generate an electric current by electromagnetic or electrostatic interaction with the electron beam, or wherein the transducer comprises a spoof surface plasmon antenna tuned to absorb at microwave frequencies for absorbing energy from the electron beam.

13. The thermionic generator of claim 1, wherein the collector comprises a negatively charged sequence of a plurality of pierced parabolic electrodes at successively more negative potentials, wherein the collector is configured to extract kinetic energy from the electron beam by electrostatic interaction with the electron beam, wherein the collector comprises one or more parabolic electrodes, or wherein the collector comprises a parabolic depressed collector.

14. The thermionic generator of claim 1, further comprising:

an external circuit coupled to one or more of the transducer or the collector and configured to receive and/or store energy extracted from the electron beam.

15. The thermionic generator of claim 1, further comprising:

a modulated power supply in communication with the emitter, the collector, the anode element, or other components of the thermionic generator for modulating voltages applied thereto.

16. The thermionic generator of claim 15, wherein the modulated power supply is configured to apply voltage pulses of various magnitudes and durations to the emitter, the collector, the anode element, or other components of the thermionic generator.

17. The thermionic generator of claim 15, wherein the modulated power supply is configured to apply a sinusoidal voltage to the anode element to modulate an intensity of the electron beam.

18. The thermionic generator of claim 15, wherein the modulated power supply comprises a flyback converter and one or more capacitors.

19. A method of converting thermal energy to electrical energy, the method comprising:

providing a converter comprising the thermionic generator of claim 1;

exposing the absorbing element to radiant energy; and controlling potentials on one or more of the emitter, the electron shaping element, the anode element, the transducer, or the collector to create the electron beam and capture energy from the electron beam as an electrical current or voltage.

20. The method of claim 19, wherein controlling the potentials includes modulating a potential applied to the anode element to control an intensity or speed of the electron beam.

* * * * *